(12) United States Patent
Sidhwa et al.

(10) Patent No.: US 6,395,629 B1
(45) Date of Patent: *May 28, 2002

(54) INTERCONNECT METHOD AND STRUCTURE FOR SEMICONDUCTOR DEVICES

(75) Inventors: Ardeshir J. Sidhwa; Stephen John Melosky, both of Phoenix, AZ (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1 day.

(21) Appl. No.: 08/840,794

(22) Filed: Apr. 16, 1997

(51) Int. Cl.⁷ .......................................... H01L 21/4763
(52) U.S. Cl. .................... 438/643; 438/637; 438/653; 438/648; 438/656; 438/672; 438/685
(58) Field of Search ................... 438/627, 628, 438/636, 643, 644, 645, 648, 653, 654, 656, 669, 685, 688, 666, 672, 637

(56) References Cited

U.S. PATENT DOCUMENTS

| | | | | |
|---|---|---|---|---|
| 4,884,123 A | * | 11/1989 | Dixit et al. | 357/71 |
| 5,195,360 A | * | 3/1993 | Doan et al. | 438/41 |
| 5,312,775 A | * | 5/1994 | Fujii et al. | 438/192 |
| 5,356,836 A | | 10/1994 | Chen et al. | 437/194 |
| 5,472,912 A | * | 12/1995 | Miller | 437/194 |
| 5,571,751 A | | 11/1996 | Chung | 437/187 |
| 5,665,643 A | * | 9/1997 | Shen et al. | 438/643 |
| 5,668,411 A | * | 9/1997 | Hong et al. | 257/751 |
| 5,677,238 A | * | 10/1997 | Gn et al. | 438/653 |
| 5,712,194 A | * | 1/1998 | Kanazawa | 438/618 |
| 5,747,361 A | * | 5/1998 | Ouellet | 438/190 |
| 5,780,323 A | * | 7/1998 | Forouhi et al. | 438/131 |
| 5,834,369 A | * | 11/1998 | Marakami et al. | 438/625 |
| 5,847,459 A | * | 12/1998 | Taniguchi | 257/751 |
| 5,851,917 A | * | 12/1998 | Lee | 438/627 |
| 5,851,920 A | * | 12/1998 | Taylor et al. | 438/648 |
| 5,930,667 A | * | 7/1999 | Oda | 438/622 |
| 5,972,786 A | * | 10/1999 | Hoshino et al. | 438/627 |
| 5,976,969 A | * | 11/1999 | Lin et al. | 438/629 |

FOREIGN PATENT DOCUMENTS

| | | | | |
|---|---|---|---|---|
| EP | 0 552 968 A2 | 7/1993 | | H01L/23/485 |
| EP | 0 690 503 A1 | 1/1996 | | H01L/23/532 |
| EP | 0 818 821 A2 | 1/1998 | | H01L/23/532 |

OTHER PUBLICATIONS

Jeong Soo Byun, Kwan Goo Rha, Jae Jeong Kim, and Woo Shik Kim, Formation of a Large Grain Sized TiN Layer Using $TiN_x$ the Epitaxial Continuity at the Al/TiN Interface, and Its Electromigration Endurance in Multilayered Interconnection, 931 Journal of Applied Physics 78 (Aug. 1, 1995), No. 3, Woodbury, NY, pp. 1719–1724.

* cited by examiner

Primary Examiner—Kevin M. Picardat
(74) Attorney, Agent, or Firm—Lisa K. Jorgenson; Daniel E. Venglarik

(57) ABSTRACT

An improved method for fabricating interconnect signal lines in integrated circuits utilizes variations from standard process conditions to relieve stress during formation of metal signal lines. This prevents AlCu stress migration and TiN ARC cracking caused by subsequent high temperature processing. A relatively planar interconnect layer, being one which does not extend through an insulating layer to make contact with an underlying conductor, includes an initial wetting layer of Ti formed over a Ti/TiN layer remaining from earlier processing steps. An AlCu layer is deposited over the Ti at a high temperature with a low deposition rate. Finally, a TiN ARC layer is formed in the usual manner. However, decreased nitrogen flow during deposition lowers the nitrogen content of the ARC layer and prevents later cracking. Deposition conditions for the AlCu layer prevent the formation of voids during subsequent high temperature processing steps.

20 Claims, 3 Drawing Sheets

US 6,395,629 B1

INTERCONNECT METHOD AND STRUCTURE FOR SEMICONDUCTOR DEVICES

BACKGROUND OF THE INVENTION

1. Field of the Invention

The present invention relates generally to the processing of semiconductor integrated circuit devices, and more particularly to a metal interconnect structure having improved reliability, and a method for making same.

2. Description of the Prior Art

As device feature sizes in semiconductor integrated circuits continue to shrink well below one-half micron, processing flaws which can be ignored for larger feature sizes become an increasing problem. Because conductors are so small, relatively minor flaws resulting from processing can have a significant impact upon the operability of a device.

Metal interconnect is increasingly used in multiple layers in more complex circuits. The very small line width of today's extremely high density devices renders metal conductors susceptible to processing flaws which could be ignored until recently. For example, two types of problems have been noticed with very small line widths in aluminum interconnect lines. The following problems in particular have been identified in connection with the Endura PVD system, but can occur in many different types of equipment.

One such problem is shown in FIG. 1. A signal line 10 is formed over a substrate 12, which is typically an interlevel insulating layer as known in the art. An aluminum layer 14 is formed over the dielectric 12 followed by a TiN anti-reflective coating (ARC) layer 16. After interconnect pattern and etch to form signal line 10, shown in cross section of FIG. 1, additional processing is performed (not shown). This processing typically includes the deposition and cure of additional interlevel dielectrics, such as spin-on glass (SOG). After such additional processing, voids such as void 18 are often found in the interconnect line 10. It is believed that such voids are caused by stress relief within the aluminum 14 during subsequent high temperature cure steps. Particularly because of the extremely small size of signal line 10, voids such as void 18 can have a significant impact upon the overall performance of the device.

A similar problem, with unrelated causes, is illustrated in FIG. 2. There, interconnect line 20 is formed over interlevel dielectric layer 22. Aluminum layer 24 is formed over interlevel dielectric, followed by TiN ARC layer 26. The device is processed in the usual way to form interconnect signal line 20. Occasionally, TiN layer 26 forms very small cracks 28, which can lead to the formation of voids 30 within the aluminum 24. As shown in FIG. 2, the size of crack 28 has been exaggerated for clarity.

As is the case with FIG. 1, formation of voids such as void 30 can interfere with proper operation of the integrated circuit device, rendering it unusable. It would be desirable to provide an improved manufacturing process, and resulting structure, which reliably solves both of these problems.

SUMMARY OF THE INVENTION

An improved method for fabricating interconnect signal lines in integrated circuits utilizes variations from standard process conditions to relieve stress during formation of metal signal lines. This prevents AlCu stress migration and TiN ARC cracking caused by subsequent high temperature processing. A relatively planar interconnect layer, being one which does not extend through an insulating layer to make contact with an underlying conductor, includes an initial wetting layer of Ti formed over a Ti/TiN layer remaining from earlier processing steps. An AlCu layer is deposited over the Ti at a high temperature with a low deposition rate. Finally, a TiN ARC layer is formed in the usual manner. However, decreased nitrogen flow during deposition lowers the nitrogen content of the ARC layer and prevents later cracking. Deposition conditions for the AlCu layer prevent the formation of voids during subsequent high temperature processing steps.

BRIEF DESCRIPTION OF THE DRAWINGS

The novel characteristics of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art. Only so much of the commonly practiced process steps are included as are necessary for understanding the present invention. The figures representing cross sections of portions of an integrated circuit during fabrication are not necessarily drawn to scale, but instead are drawn so as to illustrate the important features of the invention.

Figure 1:
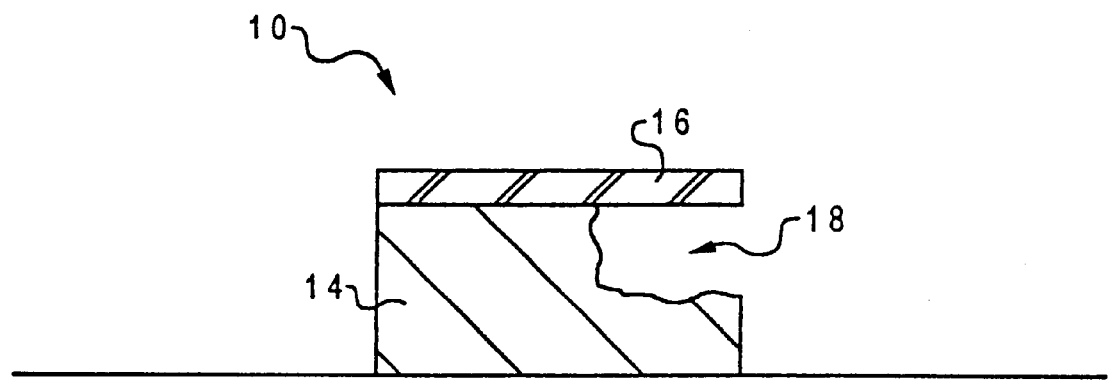
FIGS. 1 and 2 illustrate common processing problems caused by use of prior art techniques.
Figure 2:
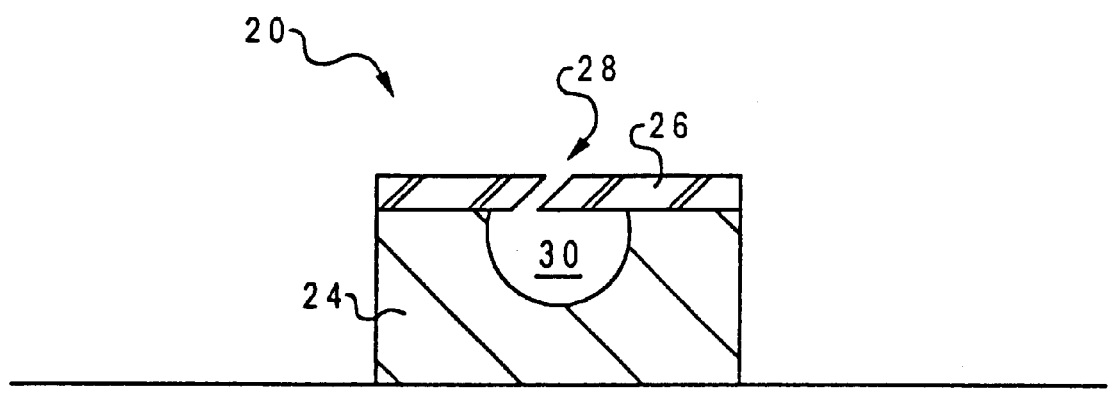
Figure 3:
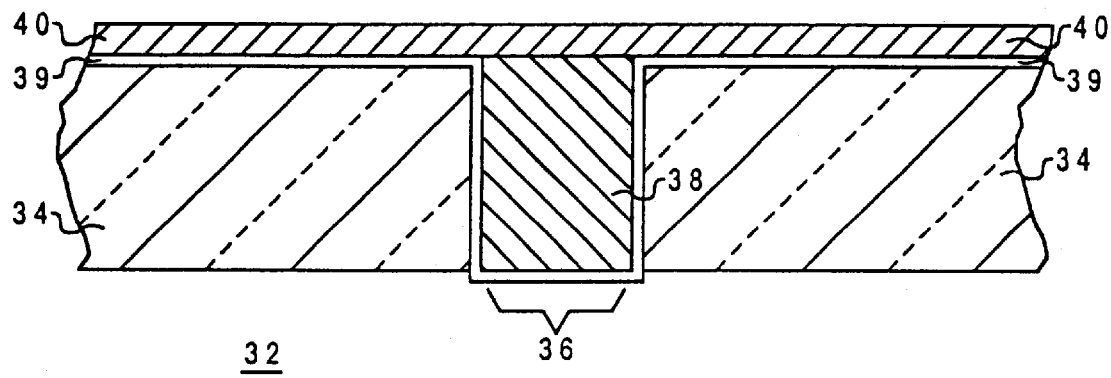
FIGS. 3–5 illustrate a preferred fabrication process, and resulting structure, in accordance with the present invention.

Referring to FIG. 3, a preferred technique for forming metal interconnect is described. An underlying layer 32 represents the upper portion of a partially fabricated integrated circuit device. Processing of the integrated circuit device has been conventional up to this point. The underlying layers may include active devices formed in a substrate, polycrystalline silicon and metal interconnect layers, and interlevel dielectric layers. Layer 32 contains at least one conductive region (not shown) to which conductive contact is to be made.

Interlevel dielectric layer 34 is formed over layer 32 in a manner known to the art. Layer 34 can be, for example, spin on glass (SOG) or other interlevel dielectric layer as desired. Although layer 34 is shown as planar in FIG. 3, it may in actuality be nonplanar due to the underlying topography of layer 32 and layers beneath it. For purposes of the present invention, planarity of dielectric layer 34 is not an issue.

Opening 36 is formed through interlevel dielectric layer 34 using photo processing and etch techniques known in the art. Opening 36 is generally referred to as a contact if layer 32 is substrate; otherwise opening 36 is generally referred to as a via. A plug of tungsten 38 is formed within contact/via 36 as known in the art. Preferably, a layer of Ti/TiN 39 is formed over the dielectric layer 34 and onto the side walls and bottom of the contact/via 36. Next, tungsten is deposited over the entire wafer, and then etched back so that the upper surface of the tungsten is approximately coplanar with the upper surface of dielectric layer 34, leaving only the tungsten plug 38. The underlying Ti/TiN layer 39 acts as an etch stop for the tungsten etch back, and remains on the dielectric layer 34 along its upper surface.

Once dielectric plug 38 has been formed, metallic adhesion and wetting layer 40 is formed over the Ti/TiN layer 39 remaining on dielectric layer 34, and over plug 38. Layer 40 is preferably formed from a layer of titanium metal. The underlying Ti/TiN layer 39 improves adhesion to the insulating layer. The titanium layer 40 acts as a wetting layer and improves the quality of the interconnect layer to be formed over it.

Figure 4:
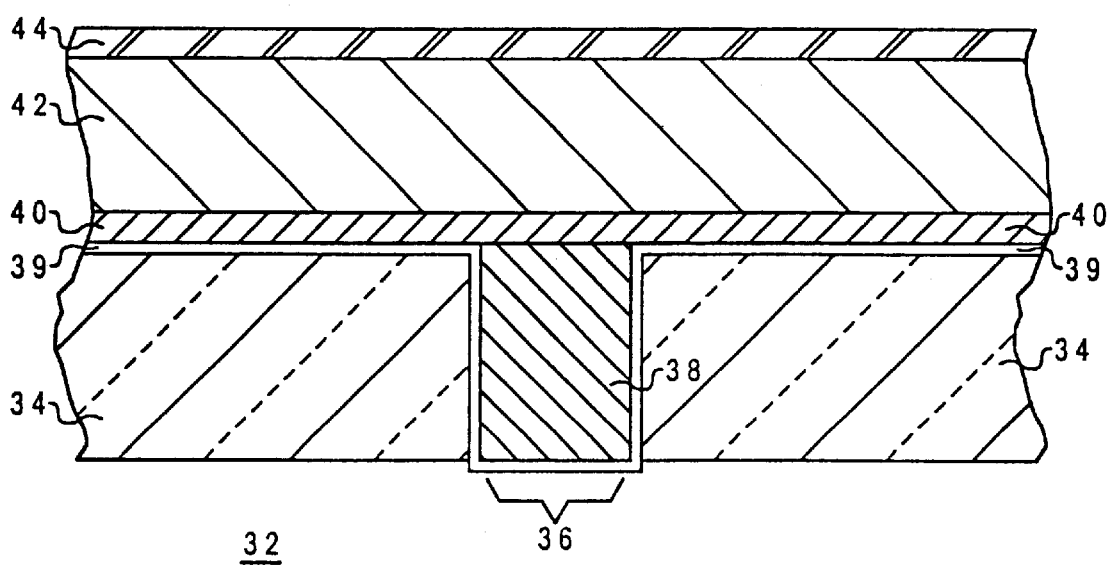

Referring to FIG. 4, aluminum layer 42 is formed over titanium layer 40. As used herein, the term "aluminum layer" generally refers to the deposition of aluminum with a small amount of one or more metals alloyed with it. Typically, layer 42 is formed from AlCu, with 0.5% Cu by weight. Other similar alloys are known in the art, and may also be used to form layer 42.

Titanium layer 40 has a thickness preferably between 200 angstroms and 400 angstroms when deposited. At the preferred deposition temperatures, deposition of the aluminum layer 42 causes most, preferably all, of titanium layer 40 to alloy with the aluminum during deposition. Aluminum layer 42 is deposited to a nominal thickness of 4,000 to 6,000 angstroms. If interconnect lines of a different thickness are needed in the integrated circuit device, aluminum layer 42 can be made thinner or thicker as desired.

During deposition of aluminum layer 42, process conditions are controlled to provide a metal layer giving improved properties after subsequent high temperature processing steps. In prior art processes of this type, the aluminum layer is typically deposited at a temperature below 450° C. at a deposition rate of 150 angstroms per second or greater. In the Endura metal deposition equipment this deposition rate corresponds to a power of approximately 8 KW.

In the method of the present invention, aluminum layer 42 is deposited at a higher temperature and a lower rate. In the preferred embodiment deposition is performed at a water temperature of approximately 460° C. or greater, which corresponds to a heater control setting of 500° C. for the Endura machine. The power setting during deposition is preferably less than approximately 4 KW. This deposition power corresponds to a deposition rate less than 100 angstroms/sec, with deposition preferably occurring at approximately 50 angstroms/second. Deposition of the aluminum alloy layer at this higher temperature and lower rate appears to relieve stress during deposition, making the aluminum layer immune to voiding during layer processing steps even with very thin (less than 1.5 micrometer) line widths.

After aluminum layer 42 has been formed, TiN layer 44 is deposited. TiN layer 44 is preferably formed in situ and deposition using the following process conditions gives an improved resulting structure. Prior art processing conditions for TiN layer 44 generally provide a $N_2$/Ar ratio of approximately 3.4:1. In the preferred process, the $N_2$/Ar ratio is lowered to approximately 1.5:1, with other deposition parameters the same as those in general use. The reduced $N_2$/Ar ratio is accomplished simply by reducing the $N_2$ gas flow during processing.

Figure 5:
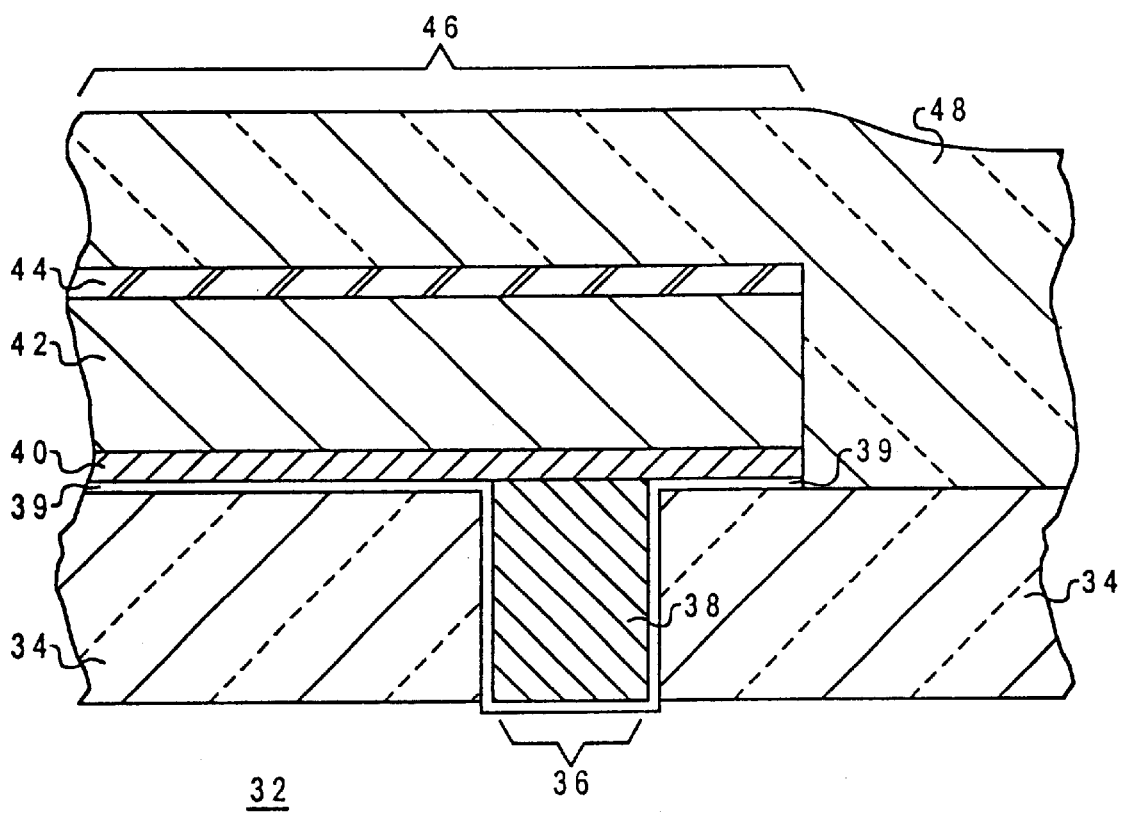

The TiN cracking seen in the prior art appears to be the result of stress of the TiN ARC layer 44. Reducing the $N_2$/Ar ratio as just described reduces the stress of TiN ARC layer 44 by approximately 3 times. It is believed that the stoichiometric ratio of the TiN layer changes from approximately 1.1 $N_2$/Ti (with the usual 3.4:1 ratio) to approximately 1.02 with the lower ratio of the present invention. Referring to FIG. 5, the stack of Ti/Tin 39, Ti 40, AlCu 42, and TiN 44 is patterned and etched using known techniques to define interconnect lines having a line width of less than approximately 1.0 to 1.5 micrometers.

Once signal line 46 has been defined, another interlevel dielectric layer 48 is formed. Preferably, this is a layer of SOG or similar material which can be planarized. Typically, processing for SOG dielectrics takes place at up to approximately 450° C. It is believed that these elevated processing temperatures cause the voiding problems seen in prior art processes. However, when the signal line 46 is formed as described above, no such voids are seen.

The process described above has the important advantages that the resulting signal lines are superior to those formed with prior art processes. In addition, the techniques used to form the signal lines are similar to process conditions previously used and do not require unusual equipment or conditions. Although the AlCu deposition is significantly slower using the preferred process, the improved quality of the resulting signal lines more than makes up for any decrease in throughput. Care must be taken not increase wafer deposition temperature above approximately 520° C. as SOG outgassing occurs, which causes voids in vias.

While the invention has been particularly shown and described with reference to a preferred embodiment, it will be understood by those skilled in the art that various changes in form and detail may be made therein without departing from the spirit and scope of the invention as set forth in the appended claims.

What is claimed is:

1. A process for forming an interconnect for an integrated circuit device, comprising the steps of:
   depositing a titanium layer over a dielectric layer having a conductive plug extending therethrough;
   depositing an aluminum layer on the titanium layer and over the conductive plug at a temperature greater than approximately 460° C. and at a deposition rate less than approximately 100 angstroms/sec; and
   patterning and etching the titanium and aluminum layers to form an interconnect signal line.

2. The process of claim 1, wherein the patterning and etching step forms a signal line having a width less than approximately 1.5 microns.

3. The process of claim 2, wherein the signal line width is less than approximately 1.0 micron.

4. The process of claim 1, wherein the deposition temperature during the step of depositing the aluminum layer on the titanium layer is less than 520° C.

5. The process of claim 1, wherein the deposition rate of the aluminum layer is approximately 50 angstroms/sec.

6. The process of claim 1, further comprising:
   forming a titanium nitride antireflective coating layer on the aluminum layer before the pattern and etch step.

7. The process of claim 6, wherein, during deposition of the titanium nitride antireflective coating layer, nitrogen is provided in a ratio of less than 3.0:1 to argon.

8. The process of claim 7, wherein, during deposition of the titanium nitride antireflective coating layer, nitrogen is provided in a ratio of approximately 1.5:1 to argon.

9. The process of claim 1, further comprising the steps of:
   before depositing the titanium layer, forming the conductive plug in an opening through the dielectric layer.

10. The process of claim 9, wherein the step of forming the conductive plug comprises the steps of:
    forming a dielectric layer;
    forming an opening through the dielectric layer;

depositing tungsten over the dielectric layer and in the opening; and etching back the tungsten to form the conductive plug, wherein the conductive plug fills the opening.

11. The process of claim 10, further comprising the step of:

before the step of depositing tungsten, forming a layer of titanium/titanium nitride on the dielectric layer and on side walls and a bottom of the opening.

12. A process for forming an interconnect signal line for an integrated circuit, comprising the steps of:

forming a dielectric layer over an underlying layer;

forming an opening through the dielectric layer to expose a conductive region therein;

forming a titanium/titanium nitride layer on the dielectric layer, and on side walls and a bottom of the opening;

forming tungsten on the titanium/titanium nitride layer and in the opening;

etching back the tungsten to form a tungsten plug filling the opening, wherein portions of the titanium/titanium nitride layer remain on the dielectric layer;

depositing titanium on the titanium/titanium nitride layer;

depositing an aluminum layer on the titanium layer and over the tungsten plug at a temperature between 460° C. and 520° C. and at a deposition rate of approximately 50 angstroms/sec;

depositing a titanium nitride antireflective coating layer on the aluminum layer using a low ratio of nitrogen to argon; and patterning and etching the layers of titanium/titanium nitride, titanium, aluminum, and titanium nitride to form an interconnect signal line.

13. The process of claim 12, wherein the aluminum layer comprises aluminum alloyed with copper.

14. The process of claim 12, wherein the ratio of nitrogen to argon during deposition of the antireflective coating layer is approximately 1.5:1.

15. The process of claim 12, wherein the titanium layer has a thickness of between approximately 200 and 400 angstroms.

16. The process of claim 12, wherein the aluminum layer has a thickness of between approximately 4,000 and 6,000 angstroms.

17. A process for forming an interconnect for an integrated circuit device, comprising:

depositing a titanium layer over a dielectric layer having a conductive plug extending therethrough;

depositing an aluminum layer on the titanium layer at a temperature greater than approximately 460° C. and at a deposition rate less than approximately 100 angstroms/sec;

forming a titanium nitride antireflective coating layer on the aluminum layer using an ambient gas having a nitrogen to argon ratio of less than 3.0:1; and patterning and etching the titanium, aluminum and titanium nitride layers to form an interconnect signal line having a width of less than approximately 1.5 microns.

18. The process of claim 17, further comprising:

depositing the titanium layer over the dielectric layer an in an opening through the dielectric layer;

depositing a tungsten layer over the titanium layer and in the opening, then patterning the tungsten layer to form the conductive plug.

19. The process of claim 17, wherein the interconnect signal line has a width of approximately 1 micron.

20. The process of claim 17, wherein the nitrogen to argon ratio during formation of the titanium nitride antireflective coating layer is approximately 1.5:1.

* * * * *